United States Patent
Hobbs et al.

(10) Patent No.: US 6,185,019 B1
(45) Date of Patent: Feb. 6, 2001

(54) HOLOGRAPHIC PATTERNING METHOD AND TOOL EMPLOYING PRISM COUPLING

(75) Inventors: Douglas S. Hobbs, Lexington; Bruce D. MacLeod, Pepperell; Adam F. Kelsey, West Newton, all of MA (US)

(73) Assignee: Optical Switch Corporation, Richardson, TX (US)

( * ) Notice: Under 35 U.S.C. 154(b), the term of this patent shall be extended for 0 days.

(21) Appl. No.: 09/312,224

(22) Filed: May 14, 1999

(Under 37 CFR 1.47)

Related U.S. Application Data

(60) Provisional application No. 60/085,528, filed on May 14, 1998.

(51) Int. Cl.[7] ........................................................ G03H 1/04
(52) U.S. Cl. .................................. 359/30; 359/34; 359/35
(58) Field of Search ................................. 359/30, 34, 35, 359/12, 577, 558, 569

(56) References Cited

U.S. PATENT DOCUMENTS

| | | |
|---|---|---|
| 3,591,252 | 7/1971 | Lu . |
| 4,037,969 | 7/1977 | Feldman et al. . |
| 4,104,070 | 8/1978 | Moritz et al. . |
| 4,402,571 | 9/1983 | Cowan et al. . |
| 4,440,850 | 4/1984 | Paul et al. . |
| 4,461,533 | * 7/1984 | Sherman et al. ........................ 359/19 |
| 4,496,216 | 1/1985 | Cowan . |
| 4,691,994 | * 9/1987 | Afian et al. .............................. 359/15 |
| 4,789,214 | 12/1988 | Vilhelmsson et al. . |
| 4,839,250 | 6/1989 | Cowan . |
| 4,874,213 | 10/1989 | Cowan . |
| 4,888,260 | 12/1989 | Cowan . |
| 4,907,973 | 3/1990 | Hon . |
| 5,003,567 | 3/1991 | Hawryluk et al. . |
| 5,055,383 | 10/1991 | Koblinger et al. . |

(List continued on next page.)

OTHER PUBLICATIONS

C.O. Bozler, C.T. Harris, S. Rabe, D.D. Rathman, M.A. Hollis, and H.I. Smith, "Arrays of gated field–emitter cones having 0.32 um tip–to–tip spacing", J. Vac Sci. Technol. B 12(2), Mar./Apr. 1994, pp. 629–632.

C.A. Spindt, "Field Emitter Arrays for Vacuum Microelectronics", IEEE Transactions On Electron Devices, vol. 38, No. 10, Oct. 1991, pp. 2355–2363.

Z. Huang, N.E. McGruer, and K. Warner, "200 nm Gated Field Emitters", IEEE Electron Device Letters, vol. 14, No. 3, Mar. 1993.

J.W. Goodman, Introduction to Fourier Optics, McGraw–Hill, San Fran., 1968.

C.G. Bernhard, "Structural and functional adaptation in a visual system.", Endeavor, 26, pp. 79–84, 1967.

P.B. Clapham and M.C. Hutley, "Reduction of lens reflexion by the 'Moth Eye' principle", Nature, 244, pp. 281–282, Aug. 3, 1973.

(List continued on next page.)

*Primary Examiner*—Jon Henry

(57) ABSTRACT

A holographic lithography tool (110) for generating a light interference pattern used to expose a photosensitive medium (119) employs a refracting prism (121) in the optical path between divergent illuminating beams (127a, 127b). The prism is optically coupled to the photosensitive medium via an index matching fluid (123). By increasing the incident beam angle and the index of refraction, the prism reduces the size of features recorded in the photosensitive material. The divergent illuminating beams are generated by a beam delivery system which preferably employs easily adjustable fiber optic cables (176, 184). Use of the prism coupling technique facilitates use of fiber-optic-compatible wavelengths in the blue region of the spectrum in a variety of applications, such a distributed feedback grating fabrication.

54 Claims, 11 Drawing Sheets

U.S. PATENT DOCUMENTS

| | | |
|---|---|---|
| 5,142,385 | 8/1992 | Anderson et al. . |
| 5,176,970 | 1/1993 | Hawryluk et al. . |
| 5,178,974 | 1/1993 | Hawryluk et al. . |
| 5,216,257 | 6/1993 | Brueck et al. . |
| 5,334,342 | 8/1994 | Harker et al. . |
| 5,343,292 | 8/1994 | Brueck et al. . |
| 5,384,464 | 1/1995 | DeFornel et al. . |
| 5,415,835 | 5/1995 | Brueck et al. . |
| 5,430,816 | 7/1995 | Furuya et al. . |
| 5,634,159 * | 5/1997 | Caregnato ............... 359/30 |
| 5,774,240 * | 6/1998 | Goto et al. ............... 359/12 |

OTHER PUBLICATIONS

M.C. Hutley & S.J. Wilson, "The optical properties of 'moth–eye' antireflection surfaces", Optica Acta, vol. 29, No. 7, pp. 993–1009, 1982.

W.H. Southwell, "Pyramid–array surface relief structures producing antireflection index matching on optical surfaces", JOSA A, vol. 8, No. 3, 549–553, Mar. 1991.

J.F. DeNatale et. al., "Fabrication and characterization of diamond moth eye antireflection surfaces on Ge", J. Appl. Phys., 71,(3), pp. 1388–1393, Feb. 1, 1992.

A.B. Harker and J.F. DeNatale, "Diamond gradient index 'moth eye' antireflection surfaces for LWIR windows", SPIE vol. 1760, Window and Dome Technologies and Materials III, pp. 261–267, Jul. 1992.

Murakami, T., Togari, H., & Steinman, A., "Electrostatic problems and ionization solutions in TFT–LCD production", Solid State Technology, Jan. 1997, pp. 99–102.

Hatoh, H., et al., "Dependence of pretilt angle on the topography of substrate in liquid crystal alignment brought about by rubbing technique", Appl. Phys. Lett., 64, (9), pp. 1103–1104, Feb. 28, 1994.

Coherent laser company specifications, Innova argon–ion laser lifetime data, 1997.

J.J. Cowan, "Holographic honeycomb microlens", Optical Engineering, vol. 24, No. 5, Sep./Oct. 1985, pp. 796–802.

Dammann, H., and Klotz, E., Optica Acta, 1977, vol. 24 pp. 505–515 Coherent Optical Generation and Inspection of Two–Dimensional Periodic Structures.

Leith, E.N., Hershey R.R., and Chen, H.S., "Techniques for high quality fringe generation", SPIE vol. 1211, Computer and Optically Formed Holographic Optics (1990) pp. 158–165.

K. Derbyshire, "Beyond AMLCDs: Field Emission Displays?", Solid State Technology, Nov. 1994, pp. 55–63.

G.P. Bryan–Brown, et.al., "Grating Aligned Bistable Nematic Device", SID 97 Symposium Digest vol. XXVIII, May 11–16, 1997, pp. 37–40.

J.P. Ryan and M. Steinberg, WDM and Optical Networks: Market Directions, Optics and Photonics News, OSA, Feb. 1998, p. 25.

M.L. Schattenburg, H.I. Smith, et. al., "Fabrication of high energy x–ray transmission gratings for AXAF", SPIE Proceedings 2280, San Diego, CA Jul. 24–29, 1994.

J. Ferrera, M.L. Schattenburg, H.I. Smith, "Analysis of distortion in interferometric lithography", J. Vac. Sci. Technol. B, 14(6), p. 4009, Nov./Dec. 1996.

H. Hock, C. King, and J. Helbert, "Resist Image Reversal for Next–generation VLSI Circuit Fabrication", Semiconductor International, Sep. 1987, pp. 164–168.

M. Long & J. Newman, "Image Reversal Techniques with Standard Positive Photoresist", SPIE Proceedings, vol. 469, Advances in Resist Technology, 1984, p. 189.

C. Hartglass, "Optimization of Image Reversal of Positive Photoresist", Proceedings of Kodk Interface, 1985.

Shank et al., "Optical Technique for producing 0.1 um periodic structures", Applied Physics Letters, vol. 23, No. 3, Aug. 1973.

* cited by examiner

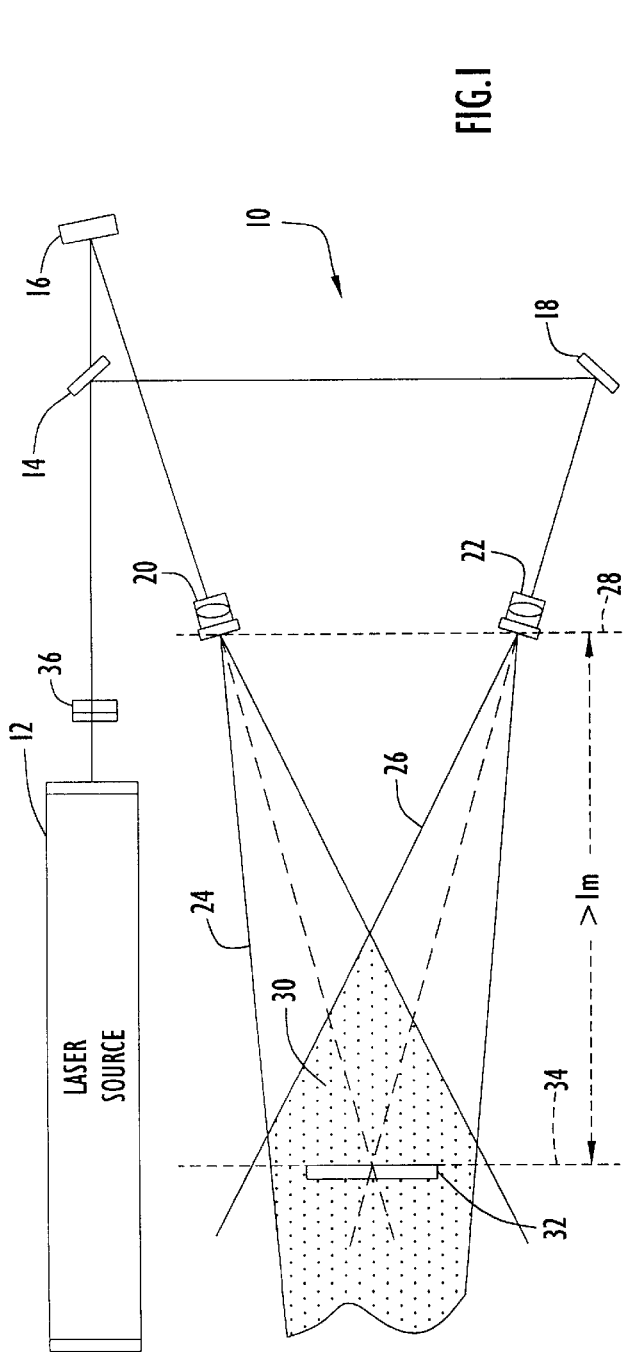
FIG. 1
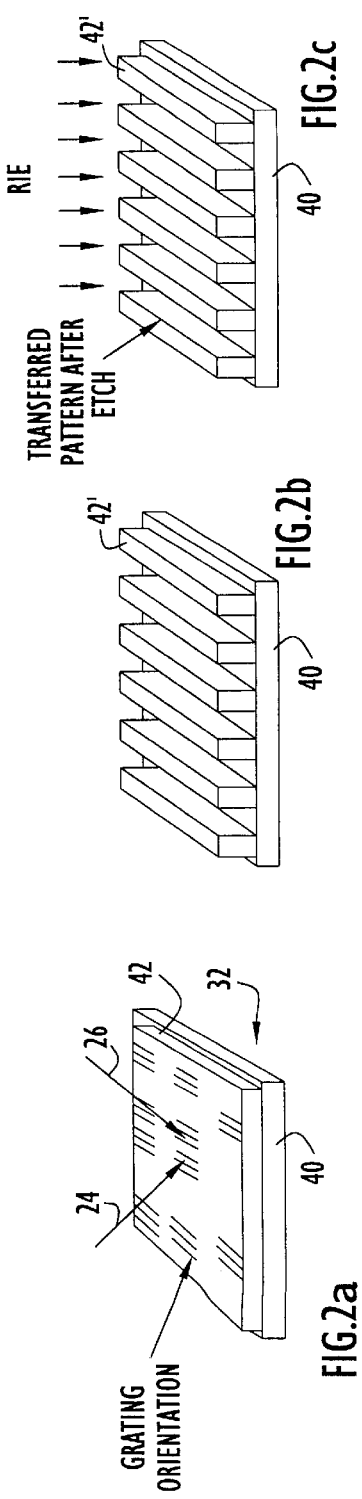

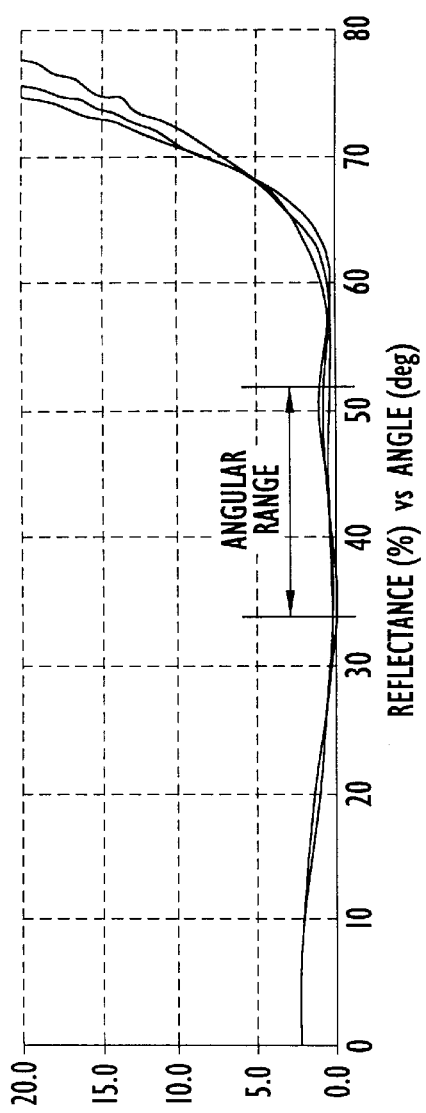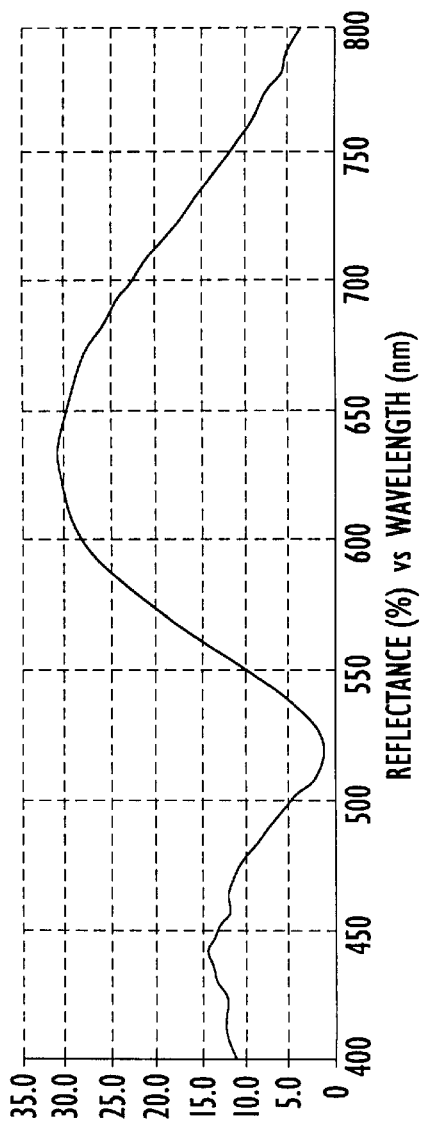

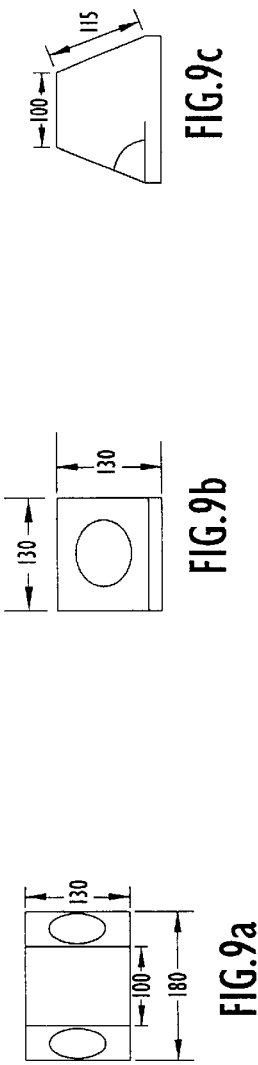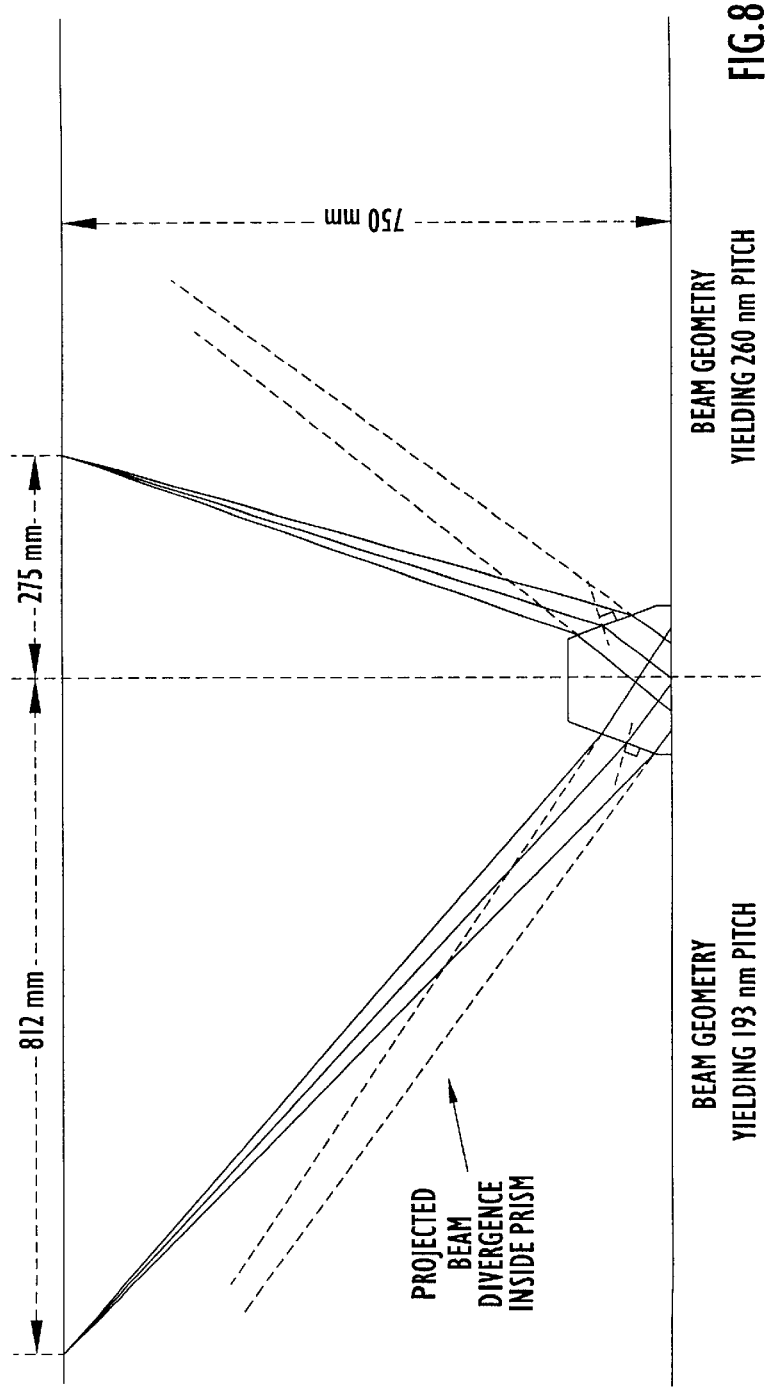

HOLOGRAPHIC PATTERNING METHOD AND TOOL EMPLOYING PRISM COUPLING

CROSS REFERENCE TO RELATED APPLICATIONS

This application claims priority from U.S. Provisional Patent Application Serial. No. 60/085,528, entitled "Holographic Patterning Method And Tool Employing Prism Coupling," filed May 14, 1998. The disclosure of this provisional patent application is incorporated herein by reference in its entirety.

BACKGROUND OF THE INVENTION

1. Field of the Invention

The present invention relates to a high throughput holographic lithography system for generating interferometric patterns suitable for selectively exposing a photosensitive material and, more particularly, to an easily reconfigurable lithographic patterning tool employing a fiber optic beam delivery system and a prism optically coupled to the photosensitive material.

2. Description of the Related Art

Holographic or interferometric lithography has been proven in laboratory environments to be feasible for generating patterns of light suitable for exposing photosensitive materials in the manufacture of devices having sub-micron features. Holographic lithography exploits the mutual coherence of multiple optical beams derived from a single light source such as a laser. The laser beams are made to overlap in some region of space and interfere to produce patterns of light and dark areas that repeat on a scale proportional to the wavelength of the light source. The interferometric patterns of light are recorded in a photosensitive medium, such as photoresist, properly positioned within the region of space. Conventional contact or projection photo masks are not required; thus, holographic lithography is known as a "maskless" lithography technique. Additionally, by exploiting inherent photoresist and etching process non-linearities, a variety of surface relief structures can be generated with no change in the optical configuration.

There are a number of applications that would benefit from the sub-micron sized structures that can be produced using interferometric patterns generated from holographic lithography techniques. For example, holographic lithography can be used to produce improved distributed feedback (DFB) gratings which are employed in the telecommunications field. More specifically, the telecommunications market is experiencing rapid growth and prosperity due to advances in fiber-optic technology and the advent of wavelength division multiplexing (WDM). WDM techniques allow the efficient combination of multi-channel (multi-carrier frequency), high-bit rate signals onto a single optical fiber. Solid state laser sources operating about wavelength bands centered at 1310 nanometers (nm) and 1550 nm are employed to transmit digital information at rates as high as 2.5 gigabits per second. These solid state lasers emit light in a multi-longitudinal mode wherein numerous narrow band wavelengths are clustered about the center wavelength. Interference between these wavelengths limits the number of channels that can be transmitted along an optical fiber.

Distributed feedback solid state lasers incorporate DFB gratings within the lasing medium to act as filters to limit the lasing output to a single narrow-banded mode. This narrow-band operation is required for long haul and high-speed telecommunications. Such gratings are typically produced via a phase mask technique or by e-beam lithography. Both techniques suffer from practical limitations such as small field size, stitching errors, short mask lifetimes, low throughput, and high cost. Thus, a practical, low cost, reliable, easily reconfigured production tool is needed to more efficiently produce DFB gratings.

Holographic, or interferometric lithography has been used experimentally to produce DFB gratings with the advantages of large area, high throughput, no stitching errors and no photomasks. The technology enables the realization of a non-contact, non-scanned, maskless pattern generator. No intermediate photomasks are required. The principal advantages of holographic lithography include: sub-half-micron resolution; nearly unlimited field size; a lensless configuration; the capability to form patterns on arbitrary surfaces; a cost effective mechanism for obtaining high yield and throughput; and compatibility with all current semiconductor, photoresist and mask production technologies.

The line arrays, or gratings required for distributed feedback are derived by recording a classical two-beam interference pattern. FIG. 1 depicts a typical laboratory system 10 for exposing a photosensitive material with a two-beam interference pattern. A laser source 12, such as a single frequency argon-ion laser, produces a laser beam that is split into two substantially equal beams by a beam splitter 14. The two beams are incident on respective turning mirrors 16 and 18 which direct the two beams toward respective spatial filters 20 and 22. Each of spatial filters 20 and 22 causes its respective laser beam to diverge, such that two divergent illuminating beams 24 and 26 are respectively projected from the two spatial filters. The points from which the illuminating beams are emitted from the spatial filters lie in a point source plane 28, and the spatial filters are oriented such that the illuminating beams overlap at some distance from the point source plane to produce a patternable volume 30. A wafer or panel 32 coated with a photosensitive material such as a photoresist is placed in the patternable volume 30 with the surface of the photosensitive material lying in a recording plane 34 that is substantially parallel to the point source plane 28. Typically, the distance between the recording plane and the point source plane is on the order of at least one meter. Exposure timing and duration can be controlled with an electronic shutter/timer 36 lying in the optical path of the laser beam (e.g., between the laser source 12 and beam splitter 14).

As shown in FIG. 2a, wafer 32 includes at least a substrate 40 coated with a photoresist layer 42. Photoresist layer 42 is subjected to two-beam holographic exposure by illuminating beams 24 and 26. Specifically, beams 24 and 26 create an interference pattern in the recording plane 34 in the form of a grating of parallel lines of high light intensity alternating with parallel lines of low light intensity. The light intensity varies sinusoidally in the recording plane 43 in the direction perpendicular to the orientation of the lines of the grating pattern.

The two expanded beams 24 and 26 overlap in the recording plane 34 to form the grating pattern and selectively expose the photoresist layer 42. This exposure creates a latent image in the photoresist consisting of parallel lines in an array. The sinusoidal intensity distribution of the interference pattern has a modulation contrast of four to one and a peak-to-peak distance, or pitch, given by the relation:

$$\Lambda = \lambda_o / (2 n_i \sin \theta_i) \quad (1)$$

where $\lambda_o$ is the vacuum wavelength, $\theta_i$ is the incident beam angle measured from the surface normal, and $n_i$ is the index of refraction of the incident medium.

After a suitable non-linear photoresist development process, a grating in the photoresist is produced which can then be employed as a mask during a subsequent etch process which replicates the grating in the distributed feedback material. Specifically, as shown in FIG. 2b, the developed photoresist layer 42' is a grating corresponding to the illumination grating pattern, with parallel lines of developed photoresist separated by linear regions where the photoresist has been removed. An etching process, such as reactive ion etching (RIE), can then employ the photoresist grating as a mask to reproduce the grating pattern in the substrate 40 (see FIG. 2c).

A graphical representation of the intensity distribution and the resulting calculated photoresist profile predicted from the measured response characteristics of a commercially available resist are respectively shown in FIGS. 3a and 3b. The nature of the photoresist grating mask that is recorded using two-beam interferometric lithography can be clearly seen in the scanning electron micrographs (SEM) of FIGS. 4a(0.8 $\mu$m pitch, 1.2 $\mu$m depth) and 4b (resist on Si, 460 nm pitch, ~200 nm CD) showing edge profile cross-sections of grating masks. Lines in the photoresist slightly less than 0.4 micron in width are located on 0.8 and 0.75 micron spacings. This grating pitch can be continuously varied simply by changing the angle between the two interfering beams. Line width uniformity over the patterned area (e.g., 60 mm) is directly impacted by the exposing beam intensity variations. These intensity variations are minimized through careful implementation of the well established holographic technique of exposure with highly divergent optical beams derived from spatial filters. Additionally, macroscopic photoresist thickness variations impacting line width uniformity can be found due to multiple reflected beam interference in the recording plane. This more subtle problem can be eliminated either by choosing the thickness of the initial photoresist layer to act as a single layer anti-reflection coating or, with highly reflecting surfaces, by employing an additional anti-reflection coating.

Holographic or interferometric lithography has application in other technologies as well. For example, holographic lithography has been proven in laboratory environments to be feasible for generating the large-area, sub-micron sized periodic structures suitable for manufacturing flat panel displays based on distributed cathode field emission display (FED) technology, a strong competitor in the flat panel display market currently dominated by liquid crystal display (LCD) manufacturers. A FED is a distributed cathode, flat panel analog to the well known cathode ray tube (CRT). Essentially, billions of miniature electron "gun" cathodes are distributed spatially over the surface of a display substrate. The most critical step in the fabrication of the FED distributed cathode matrix is patterning of an array of holes or wells in which emitter cones are grown. Conventional photo-lithographic techniques such as shadow masking (contact printing), optical projection, and electron or laser beam direct writing have proven ineffective in producing commercially useful hole arrays. As described in U.S. patent application Ser. No. 09/202,367, the disclosure of which is incorporated herein by reference in its entirety, holographic lithography holds promise to realize the potential of FED technology by providing an inexpensive, high speed, production environment tool, incorporating a patterning technology capable of producing large-area, high-density, sub-micron diameter hole arrays with few defects and at low cost.

Other useful surface relief structures can be patterned using holographic lithography, such as a "motheye" or sub-wavelength-structure (SWS) surfaces. Motheye surface structures have been shown to be effective for nearly eliminating the reflectance of light from an optical interface such as between air and a window or a refractive optical element. The term "motheye" is derived from the insect's eye, a natural analog; the eye of a nocturnal insect (e.g., a moth) reflects little or no light regardless of the light wavelength or the angle at which incident light strikes the eye surface. The eye surface functions in a manner similar to a graded index material, essentially allowing the smooth transition between media with differing bulk density. To avoid diffraction effects, synthetic motheye surfaces must be fabricated with feature sizes and spacings smaller than the wavelength of light incident upon the surface. For most infrared or visible wavelength applications, this necessitates structure spacings in the sub-micron to sub-half micron range, patterned over the entire surface (e.g., window or optic area). A means for manufacturing motheye structures in high volumes and over large areas is not available in the prior art and a variety of products could benefit from the increased ruggedness and anti-reflective performance afforded by motheye surfacing over large areas.

Holographic lithography also has application in the manufacturing of liquid crystal displays (LCDs). Liquid crystals (LCs) are anisotropic molecules which can affect the properties of light with which they interact, and, under the influence of an electric field, can vary the magnitude of this effect. LCDs are formed by the creation of a cell, typically constructed using glass, within which the LC molecules are confined. The term "crystal" refers to the structure or ordering of the LC molecules into a definable or measurable state typically found with molecules in a solid state. This artificially created ordering is accomplished by depositing thin layers of material on the boundaries of the cell, which either physically, or electrostatically force the LC molecules to preferentially align in one direction. The "alignment layers" as they are known in the art, are typically processed using a physical rubbing or buffing technique comprising a spinning drum or cylinder and rolling it over the cell substrate coated with alignment material. High levels of hazardous static charge and spreading particulate (from the rubbing material) are generated during this process; in addition, manufacturing yields can be improved.

Holographic lithography can potentially increase LCD manufacturing yield by providing a non-mechanical, non-contact alignment layer formation process wherein alignment material layers are produced by patterning surface structures. This technique avoids problems with static charge and is compatible with existing manufacturing equipment and environments. Specifically, holographic lithography techniques can be used to produce surface structure LC alignment layers with the enhanced anti-reflective properties of motheye surfaces. By producing sufficient asymmetry in the surface structures, the patterning process allows control of both angular rotation and angular tilt of the LC molecules with respect to the cell walls.

Holographical lithography demonstrations in the laboratory have employed UV wavelength light derived from an argon ion gas laser which is highly automated and reliable, making it a good choice for a manufacturing tool. A wavelength in the deep blue spectral range is also available with argon ion gas lasers. UV wavelength light has a number of advantages. A large variety of photoresists possess high sensitivity to energy in the near-UV spectral range, whereas the number of photoresists sensitive to energy having a visible blue wavelength is more limited, and, in those photoresists, sensitivity is typically lower. Further, the shorter UV wavelength permits formation of smaller features relative to a comparable system employing blue wavelength light. For example, in the case of two-beam exposure for forming DFB gratings, it can be seen from equation (1) that the a longer wavelength produces a proportionally greater grating pitch.

However, for a number of reasons, the blue wavelength would be a more practical choice for a manufacturing tool. First, the divergence of an optical beam for a given waist or aperture size decreases for shorter wavelengths, a relationship having a direct impact on field size in the proposed system. For a given aperture size, the field size is 30% larger for 458 nm (blue) light than for 351 nm (UV) light. Second, alignment and maintenance of a holographic setup is greatly simplified when operating with a visible, relatively eye-safe light source. Third, laser lifetime for the argon-ion gas laser is dramatically reduced when operated at near-UV wavelengths. Consequently, a production environment laser is expected to last up to two times longer when operated at 458 nm (blue light). Further, in order to have a flexible and easily reconfigurable beam delivery system (e.g., adjustable beam positions and angles), it would be desirable to employ optical fibers to deliver plural coherent beams from a common source to the point source plane (as opposed to beams delivered via free space and discrete components such as mirrors and filters). As explained in greater detail below, in addition to being easily repositioned, optical fibers can act as natural spatial filters, causing the laser beams to diverge when emitted from one end, thereby eliminating the need for separate spatial filters. However, to date, the specialized optical fibers suitable for use in such a beam delivery system exhibit inferior, unstable, and impractical performance when guiding UV wavelength light. Thus, for this additional reason, blue wavelength light is desirable.

However, as previously explained, the laser light in the blue region of the visible spectrum has a longer wavelength than UV light. All other parameters being equal, the larger wavelength of blue light results in a corresponding enlargement of the interference pattern relative to that produced by UV light. This enlargement is particularly problematic in the context of producing DFB gratings. To be useful, DFB gratings must be produced with a grating pitch as small as approximately 200 nm. Referring to the equation (1), it can be seen that the range of values for the grating pitch is limited by the physical characteristics of the optical setup. The smallest pitch attainable is given by $\lambda_2/n_i$ when the incident beam angles are 90° with respect to normal. Whereas 200 nm pitch sizes can be achieved with 351 nm UV wavelength light, 457.9 nm blue wavelength light cannot produce 200 nm gratings in a comparable system.

Thus, while the desire to have an easily adjustable optical-fiber-based system and other considerations lead to the selection of a visible (blue) wavelength, blue wavelength light results in a somewhat larger interference pattern that is unacceptable in certain applications. Accordingly, there remains a need in the art to address the limitations imposed by employing blue light.

SUMMARY OF THE INVENTION

It is an object of the present invention to provide a holographic lithography tool and method for generating interference patterns suitable exposing photosensitive materials.

It is another object of the present invention to facilitate the use of a fiber optic beam delivery system within a holographic lithography tool by employing light having a fiber-optic compatible wavelength.

It is another object of the present invention to overcome the disadvantages of using blue light by compensating for the relatively long blue light wavelength.

It is a further object of the present invention to decrease feature sizes of latent images formed in a photosensitive material by increasing the incident index of refraction and the incident beam angle at the photosensitive material.

It is a still further object of the present invention to permit fabrication of gratings having sub-half-micron pitch sizes using beam wavelengths normally incompatible with such pitch sizes in an ambient gaseous or vacuum environment.

It is another object of the present invention to permit a reduction in the necessary size of a holographic lithography tool by increasing the effective incident beam angle on the photosensitive material.

The aforesaid objects are achieved individually and in combination, and it is not intended that the present invention be construed as requiring two or more of the objects to be combined unless expressly required by the claims attached hereto.

According to the present invention, the aforementioned advantages of using blue wavelength light can be realized while avoiding the disadvantages normally attendant use of blue light by employing a refracting prism in a holographic lithography tool that generates a light interference pattern for exposing a photosensitive material. The prism lies in the optical path between divergent illuminating beams and the photosensitive to be exposed and is optically coupled to the photosensitive material via an index matching fluid. As the illuminating beams pass through the prism, they are refracted prior to impinging on the photosensitive material. Consequently, the incident beam angle is increased. From equation (1), it can be seen that the resulting pitch size of the interference pattern and the resulting grating is reduced by the prism due to the higher index of refraction and the greater incident beam angle. Consequently, gratings on the order of 200 nm (required for telecommunications applications) can be generated using relatively long wavelength blue light (relative to UV).

The use of blue wavelength light permits the use of a fiber-optic-based beam delivery system, thereby making the holographic lithography tool more commercially viable as a result of the ease with which optical fibers can be manipulated to provide a wide range of beam configurations.

The prism can be, for example, a glass prism having faces corresponding to the illuminating beams and a base which faces the photosensitive material. The prism is optically coupled to the photosensitive material via an index matching fluid disposed in a narrow gap lying between the prism base and the surface of the photosensitive material. The index matching fluid can be, for example, water, such as distilled water.

The prism-coupling technique of the present invention can be used in any system requiring patterning of a photosensitive material, including the aforementioned applications in FED technology and surface texturing, such as formation of motheye surfaces and LCDs.

The above and still further objects, features and advantages of the present invention will become apparent upon consideration of the following detailed description of a specific embodiment thereof, particularly when taken in conjunction with the accompanying drawings wherein like reference numerals in the various figures are utilized to designate like components.

BRIEF DESCRIPTION OF THE DRAWINGS

FIG. 1 is a diagrammatic view of two-beam holographic lithography tool for recording a linear grating pattern in a photoresist.

FIGS. 2a–2c illustrate a wafer at different processing stages of forming a grating in the wafer.

FIGS. 6a and 6b are respectively graphs of reflectance versus incident beam angle and reflectance versus wavelength for an indium phosphide wafer coated with an antireflection layer and a photoresist layer.

FIG. 8 is a diagrammatic view of a refracting prism optically coupled to a photosensitive layer of a wafer in accordance with another embodiment of the present invention.

FIGS. 9a, 9b and 9c are respectively a top plan view, a side view in elevation and a front view in elevation of the prism shown in FIG. 8.

DESCRIPTION OF THE PREFERRED EMBODIMENTS

In accordance with the present invention, the limitations imposed by using the more preferable blue wavelength light are overcome by employing a refracting prism in the optical path of the divergent illuminating beams to compensate for the longer wavelength of the blue light, thereby permitting the use of a blue-light-compatible fiber optic beam delivery system in applications such as the production of DFB gratings. Referring again to equation (1), it can be seen that the grating pitch resulting from a two-beam interference pattern can be reduced by employing a higher-density incident medium with a higher index of refraction ni in the blue wavelength region to produce a grating pitch in the specified 200 nm range. According to the present invention, this increase is achieved by placing a suitable refracting prism in optical contact with the photosensitive material to be exposed.

Figure 3A:
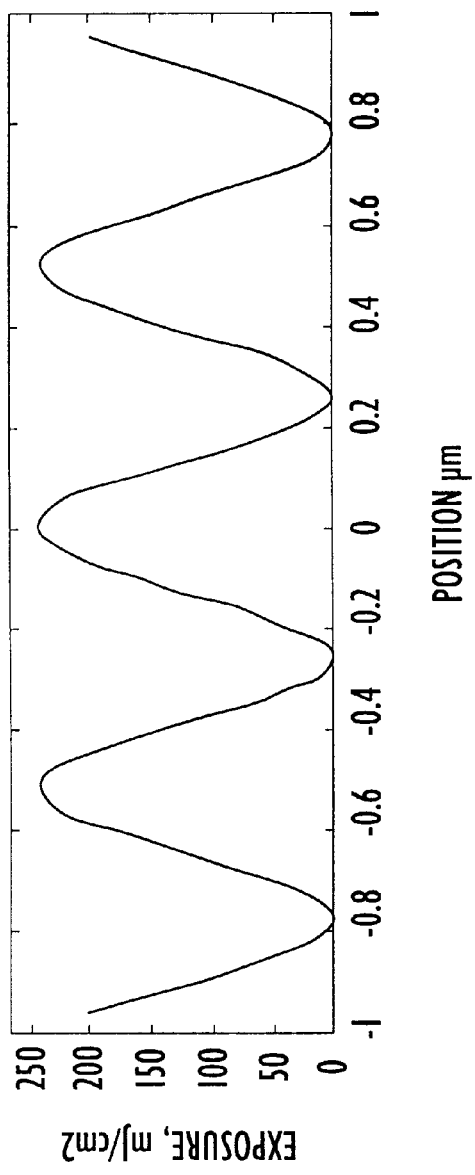
FIGS. 3a and 3b are graphical representation of the intensity distribution and the resulting calculated photoresist profile predicted from the measured response characteristics of a photoresist.
Figure 3B:
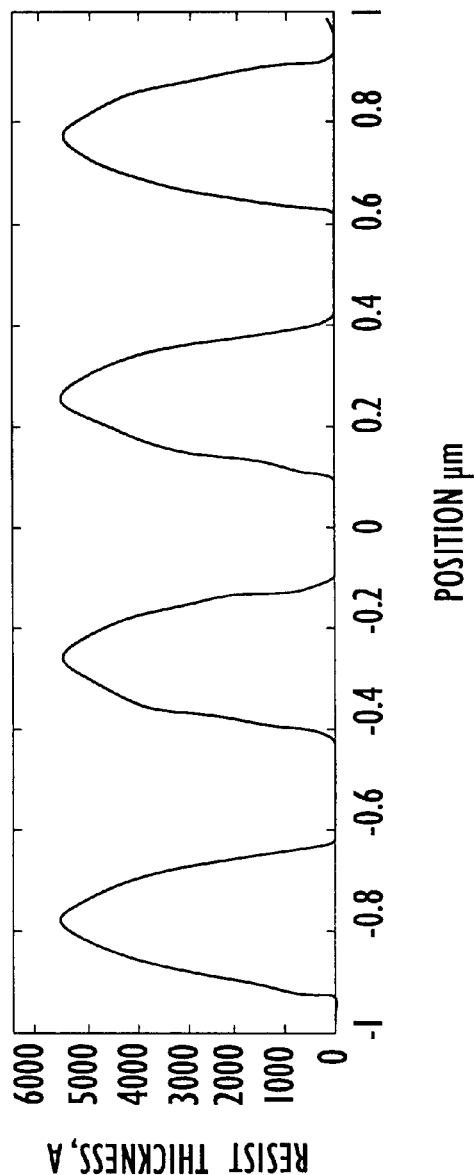
Figure 4B:
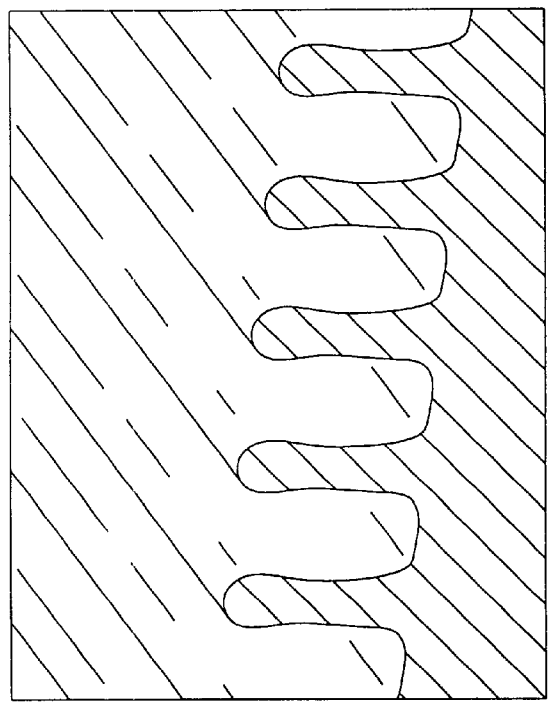
FIGS. 4a and 4b are edge profile scanning electron micrographs (SEMs) of photoresist grating masks recorded using two-beam interferometric lithography.
Figure 4A:
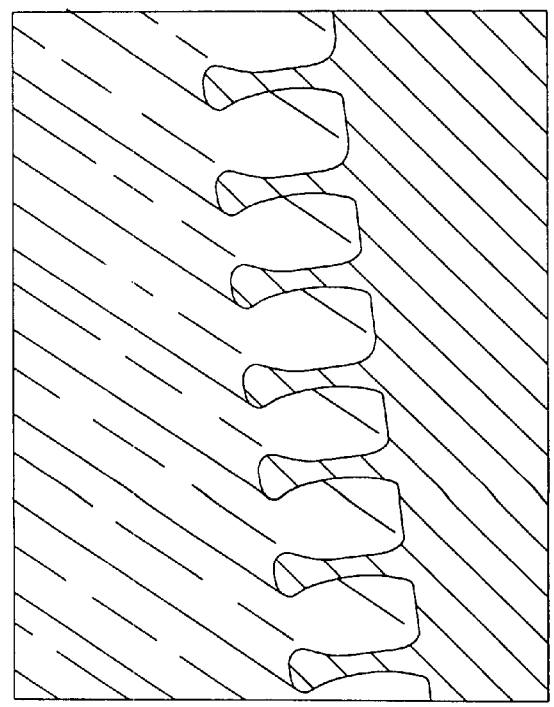
Figure 5:
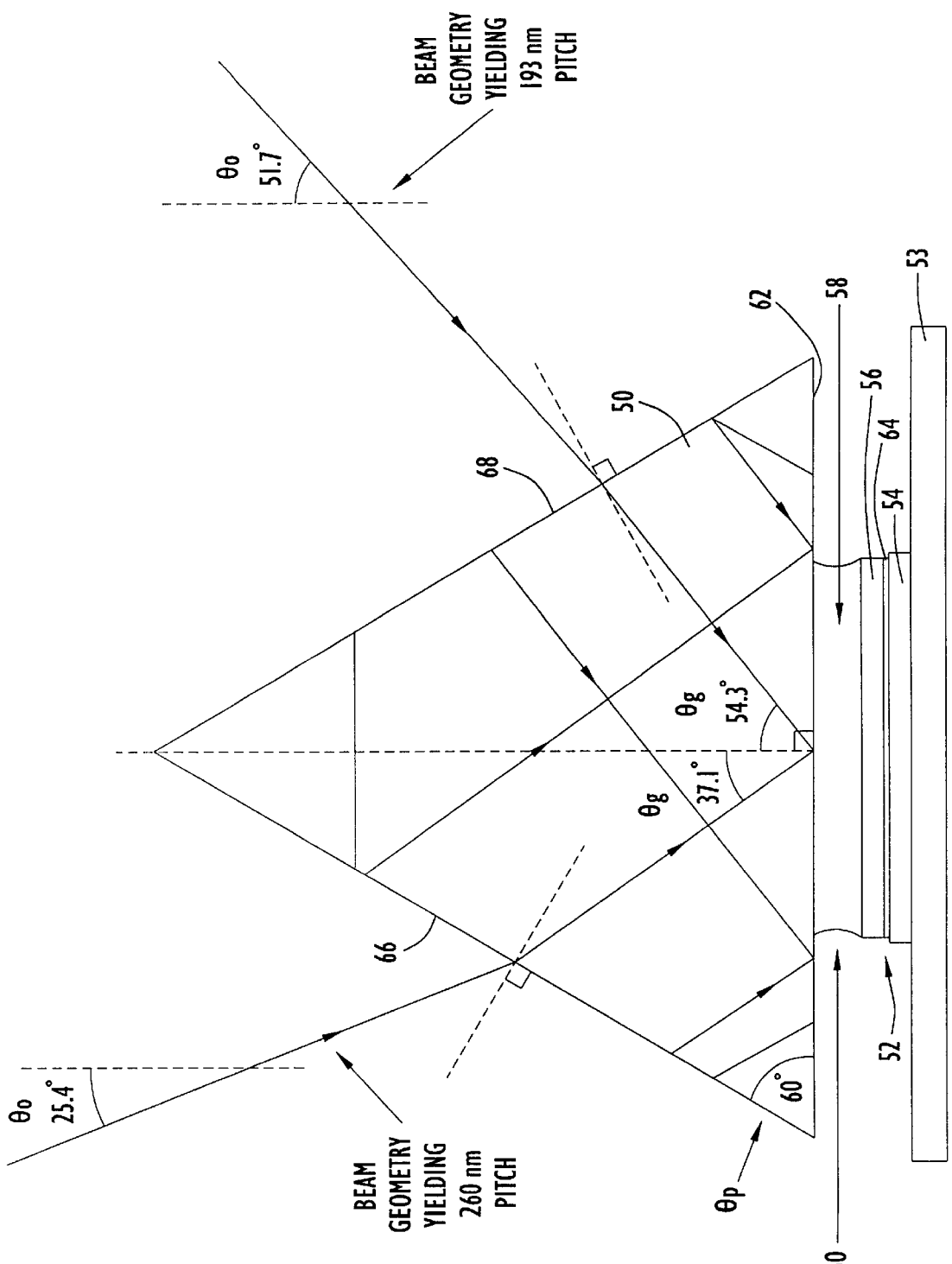
FIG. 5 is a diagrammatic view of a refracting prism optically coupled to a photosensitive layer of a wafer in accordance with an exemplary embodiment of the present invention.

FIG. 5 is a diagrammatic illustration of a refracting glass prism 50 in optical contact with a photoresist coated workpiece 52 mounted on a platform 53. As used herein, the term prism refers to any optical element or process that has an index of refraction greater than that of the ambient (gaseous or vacuum) environment, including, but not limited to: conventional prisms, generally rectangular blocks of optical material, and other transparent refractive media including refractive glass elements. As used herein, a workpiece is defined to include a layer of photosensitive material by itself or in combination with other layers of materials, such as a substrate and/or other intervening layers, including planar, non-planar and irregularly shaped objects. For example, the workpiece can be a wafer or panel. In the exemplary embodiment shown in FIG. 5, workpiece 52 is a wafer having an InP substrate 54 and a photoresist coating 56 having a thickness of approximately 1500 angstroms (Å). As used herein, the term platform includes any mounting mechanism to which the workpiece can be secured in a desired position and orientation, including, but not limited to a wafer stage and vacuum chuck arrangement. Optionally, the position of the platform can be controlled to correctly position the workpiece relative to the prism and beam delivery system (e.g., the platform can be slidable to insert and remove workpieces in a manufacturing process).

An index matching fluid 58 placed in a gap 60 between the wafer 52 and the base 62 of prism 50 makes a liquid optical contact between the photoresist layer and the prism. The index matching fluid can be, for example, an immersion oil. However, in accordance another novel aspect of the present invention, it has been found that water (e.g., tap water, de-ionized water or distilled water) can be used as the index matching fluid. Distilled water provides particularly good performance. The index matching fluid effectively removes the interface between the glass prism 50 and the sample wafer 52, and reflectivity of wafer 52 is minimized for an incident medium with an index matching the prism material. The index matching fluid substantially "matches" the index of refraction of the prism in the sense that the fluid's index of refraction is sufficiently similar to that of the prism to reduce reflections to an acceptable level. In the exemplary embodiment shown in FIG. 5, the gap 60 filled by index matching fluid 58 is preferably in the range between approximately 1 mm and 5 mm. Experimentation has shown that excellent performance results with a gap size between approximately 1 mm and 2 mm.

In the case of a highly reflective wafer such as indium phosphide, a single layer of photoresist may not be sufficient to suppress the deleterious effects of stray interference from reflected beams. As shown in FIG. 5, the use of an anti-reflection coating (ARC) 64 between the substrate and photoresist layers 54 and 56 can be used to eliminate reflections. FIG. 6a shows a plot of the calculated reflectance versus angle at a wavelength of 458 nm for an indium phosphide wafer coated with a 920 Å thick anti-reflection layer and a 2850 Å thick photoresist layer (AZ1505) placed in optical contact with a glass prism (Corning glass type 1737F or BK7). FIG. 6b shows a plot of the calculated reflectance versus wavelength for the same indium phosphide wafer. Such an anti-reflection coating is sufficient to suppress reflections for incident angles covering the entire range of grating pitches specified; i.e., one coating process can be used to pattern any grating pitch (other applications require tuning of the resist and ARC thickness as a function of pattern pitch).

Referring again to FIG. 5, prism 50 has two inclined faces 66 and 68 which respectively receive the two incident illuminating beams emanated by the beam delivery system (not shown in FIG. 5). Prism 50 can be made, for example, from DUV grade fused silica having an index of refraction $n_i$ of 1.46 (note that the prism, optically coupled to the wafer, is the incident medium with respect to the photoresist). An equilateral prism (wherein the angle $\theta_p$ between each face of the prism and the prism base 62 is 60°) can be employed to minimize the maximum incident angle $\theta_o$ in air to a practical level, approximately 52° for a 193 nm pitch grating. To illustrate the effect that varying the incident beam angle has on the resulting grating pitch size, two different beam geometries are respectively shown for the two prism faces in FIG. 5. In operation, of course, both beams are at the same angle. The incident beam angle in air $\theta_o$ (measured relative to the photoresist surface normal) is related to the incident beam angle in fused silica (i.e., the prism) $\theta_g$ by the relationship:

$$\theta_o = \theta_p - \sin^{-1}[n_i \sin(\theta_p - \theta_g)] \text{ or } \theta_g = \theta_p - \sin^{-1}[(1/n_i)\sin(\theta_p - \theta_o)] \quad (2)$$

The illuminating beams are directed through prism faces 66 and 68, where they are refracted toward the prism base and overlap substantially in the plane of the photoresist layer 56 of wafer 52. From equations (1) and (2), for blue wavelength light ($\lambda_o$=457.9 nm) and for an equilateral prism ($\theta_g$=60°) having an index of refraction $n_i$ of 1.46, an incident beam angle in air $\theta_o$ of 25.40° yields a refracted incident beam angle on the wafer $\theta_g$ of 37.1° and a grating pitch $\Lambda$ of 260 nm, while an incident beam angle in air $\theta_o$ of 51.7° yields a refracted incident beam angle on the wafer $\theta_g$ of 54.3° and a grating pitch $\Lambda$ of 193 nm. Thus, any grating pitch in the range between 193 nm and 260 nm can be achieved by varying the incident beam angle in air $\theta_o$ between 51.7° and 25.4°. Note from equation (1) that use of the prism in optical contact with the photoresist surface of the wafer reduces the pitch size both by increasing the incident index of refraction and by increasing the incident beam angle (relative to that in the ambient environment).

Figure 7A:
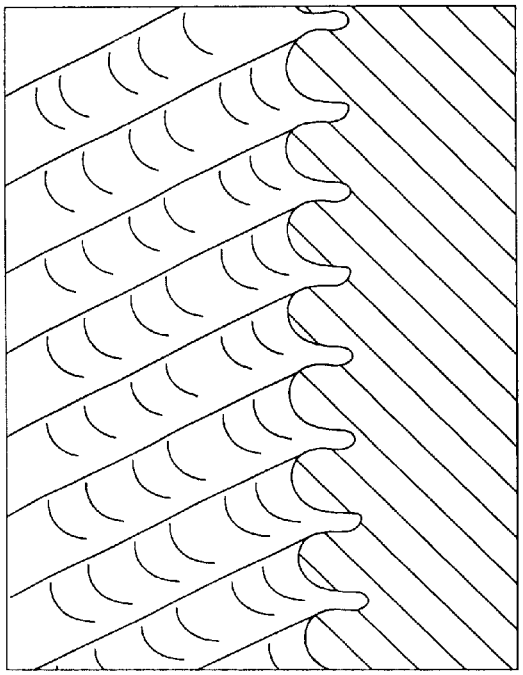
FIGS. 7a and 7b are SEMs of photoresists exposed using the prism coupling technique of the present invention.
Figure 7B:
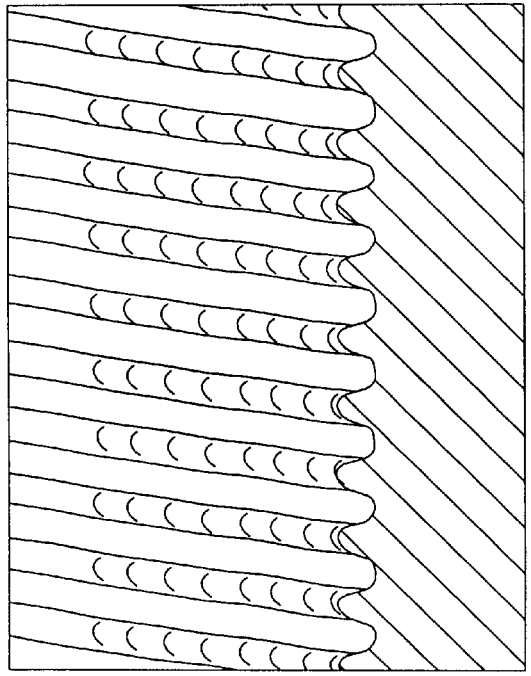

Employing a laboratory prototype, tests have been conducted to demonstrate the practicality of the prism coupling technique of the present invention. Gratings have been patterned on both silicon and indium phosphide wafers of up to 75 mm diameter. FIG. 7a shows a scanning electron microscope (SEM) photograph of a photoresist exposed using prism coupling (45° prism) and having a 200 nm pitch grating. FIG. 7b shows a SEM photograph of a photoresist exposed using a 60° prism and having a 233 nm pitch grating.

FIG. 8 depicts a beam position and prism arrangement according to another embodiment of the prism-coupled illuminator of the present invention. As with FIG. 5, the left side of the drawing depicts the optical path of the illuminating beam in a configuration yielding one pitch grating (193 nm), and the right side shows a ray tracing of the optical path required for producing another pitch grating (260 nm). The dashed lines shown in FIG. 8 represent the projected beam divergence of the refracted beams within the prism. The illuminating beam point sources are located in a plane spaced a fixed height (e.g., 750 mm) above the plane containing the wafer. This forces the point sources to be redirected when the pitch is varied such that the beam centroid is shifted along the prism face to maintain the optimum overlap in the wafer plane. In the configuration shown on the left side of FIG. 8, the illuminating beams are positioned at a distance of 812 mm in a direction normal to a vertical plane passing through the center of the prism in a longitudinal direction (into the page in the figure) at an angle of $\theta_o$=46.79°. In the configuration shown on the right side of FIG. 8, the illuminating beams are positioned at a distance of 275 mm from the vertical centerline plane of the prism at an angle of $\theta_o$=17.51°. A prism angle of 70° was chosen to realize a smaller illumination angle in air, and a greater decrease in divergence upon entering the prism. Angles larger than 70° yield diminishing returns. The choice of prism angle is largely a tradeoff between overall tool footprint and tool height. The shape and size of the prism is designed to avoid parasitic optical effects such as grating noise introduced via reflection of stray light. With this configuration, and with proper setting of the wafer reflectivity, the prism faces could be left without anti-reflection coatings at the expense of longer exposure times due to reflection losses.

From equations (1) and (2), for blue wavelength light ($\lambda_o$=457.9 nm) and for a prism having a face angle $\theta_g$ of 70° and an index of refraction $n_i$ of 1.46, an incident beam angle in air $\theta_o$ of 46.79° yields a refracted incident beam angle on the wafer $\theta_g$ of 54.34° and a grating pitch $\Lambda$ of 193 nm, while an incident beam angle in air $\theta_o$ of 17.51° yields a refracted incident beam angle on the wafer $\theta_g$ g of 37.09° and a grating pitch $\Lambda$ of 260 nm. Thus, any grating pitch in the range between 193 nm and 260 nm can be achieved by varying the incident beam angle in air $\theta_o$ between 46.79° and 17.51°.

FIGS. 9a, 9b and 9c respectively show a top plan view, a longitudinal side view in elevation, and a transverse side view in elevation of the prism shown in the exemplary embodiment of FIG. 8. The prism has a generally trapezoidal transverse cross-sectional shape (FIG. 9c), with a top flat surface 100 mm wide, a base 180 mm wide and beam receiving faces extending 115 mm from the top flat surface. The prism is 130 mm long in the longitudinal direction (into the page in FIG. 8), and the overall prism height is 130 mm (FIG. 9b). The ellipses shown in FIGS. 9a and 9b represent nominal footprints of the illuminating beams on the prism faces.

Figure 10:
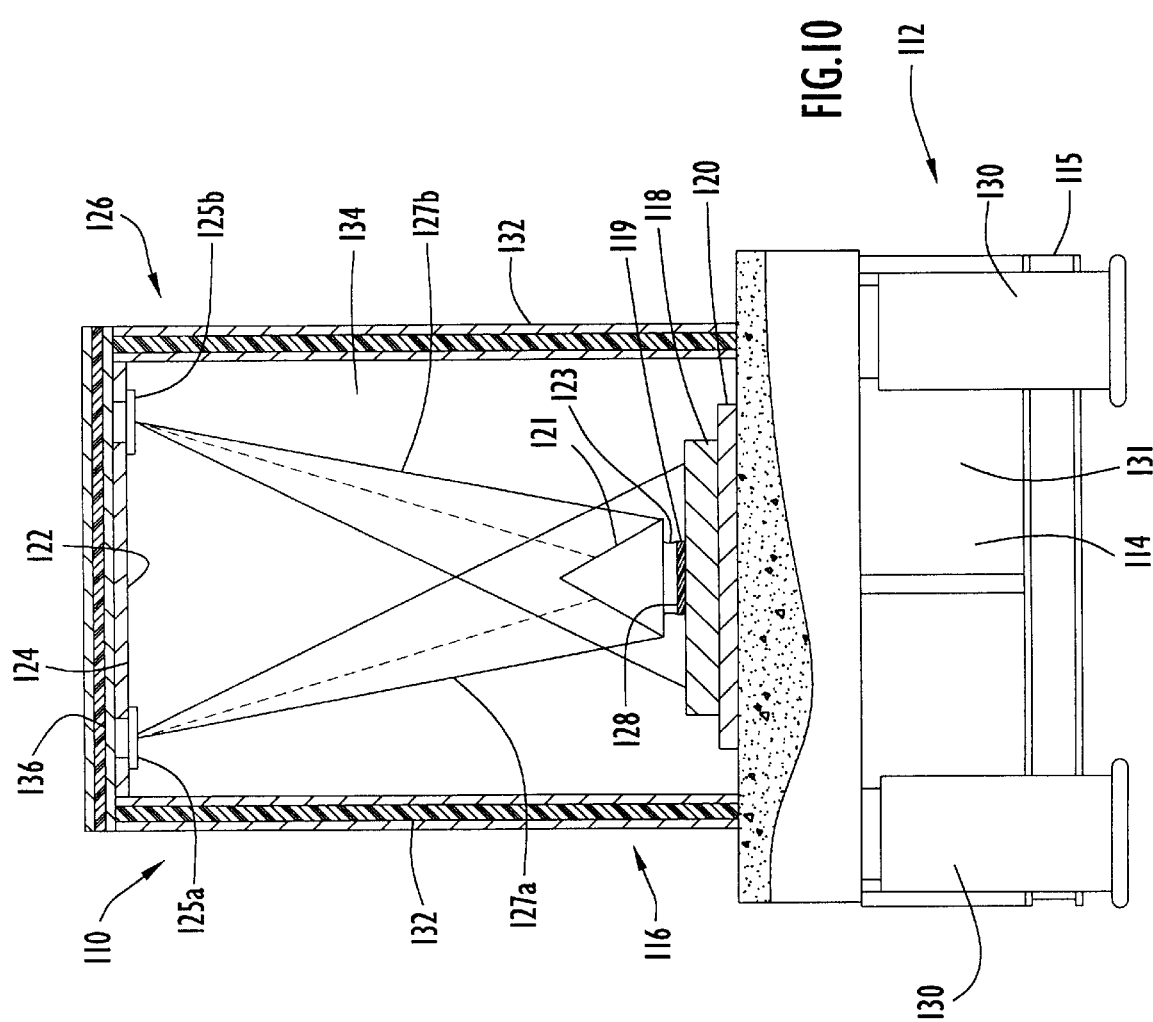
FIG. 10 is a front elevation view in partial cross section of a patterning tool according to the present invention.

FIG. 10 is a front elevation view in partial cross section illustrating an exemplary holographic lithography patterning tool 110 employing the prism coupling technique of the present invention. Patterning tool 110 includes three main levels: a lower level 112, a middle level 116 and an upper level 126. The lower level 112 contains a laser illumination source 114 on a platform 115. The middle level 116 is a platform (e.g., a mount or chuck) 118 (i.e., for workpiece 119) and X-Y translation stage 120. Workpiece 119 is in optical contact with a refracting prism 121 via an index matching fluid 123. The upper level 126 includes a beam delivery breadboard 122 mounted in a gantry support system 124 supporting first and second carriage mounted fiber positioning stages 125a and 125b.

To perform high precision patterning, it is necessary to isolate the laser beam paths 127a and 127b and the recording plane (e.g., the upper surface 128 of workpiece 119) from vibrations due to excessive air flow, mechanical equipment vibrations, acoustic noise and any other ambient source of vibration. Vibration isolation is provided for all three levels 112, 116 and 126 in patterning tool 110 using four vertical pneumatic passive damping supports 130. Pneumatic supports or isolators 130 float the patterning tool 110 on compressed air. To attenuate vibrations from air currents and airborne acoustic noise, both the laser source walls 131 and the patterning chamber walls 132 are enclosed using aluminum or stainless steel skinned, foam core panels typical of modern clean room wall coverings.

Patterning tool 110 includes a patterning chamber 134 enclosed by four patterning chamber walls 132 and a chamber lid 136. Patterning chamber 134 can be sealed and, when sealed, is optically enclosed or light tight. Mutually coherent laser beams shine downwardly from the fiber positioning stages 125a and 125b along the laser beam paths 27a and 27b and are aimed toward panel mount 118 which acts as a platform to support a workpiece 119 to be subjected to the holographic lithography process of the present invention. An aiming point on the panel's upper surface is approximately at the center of the laser beam paths 27a and 27b.

Patterning tool 110 can be controlled using a computer (not shown) that interfaces with the driving electronics, directs the patterning sequence, and monitors the tool system status. The laser source 114 can be temperature controlled via a stand-alone water-to-water heat exchanger (not shown). A conventional electric air compressor (not shown) provides the requisite compressed air for the pneumatic table isolation supports 130.

Figure 11:
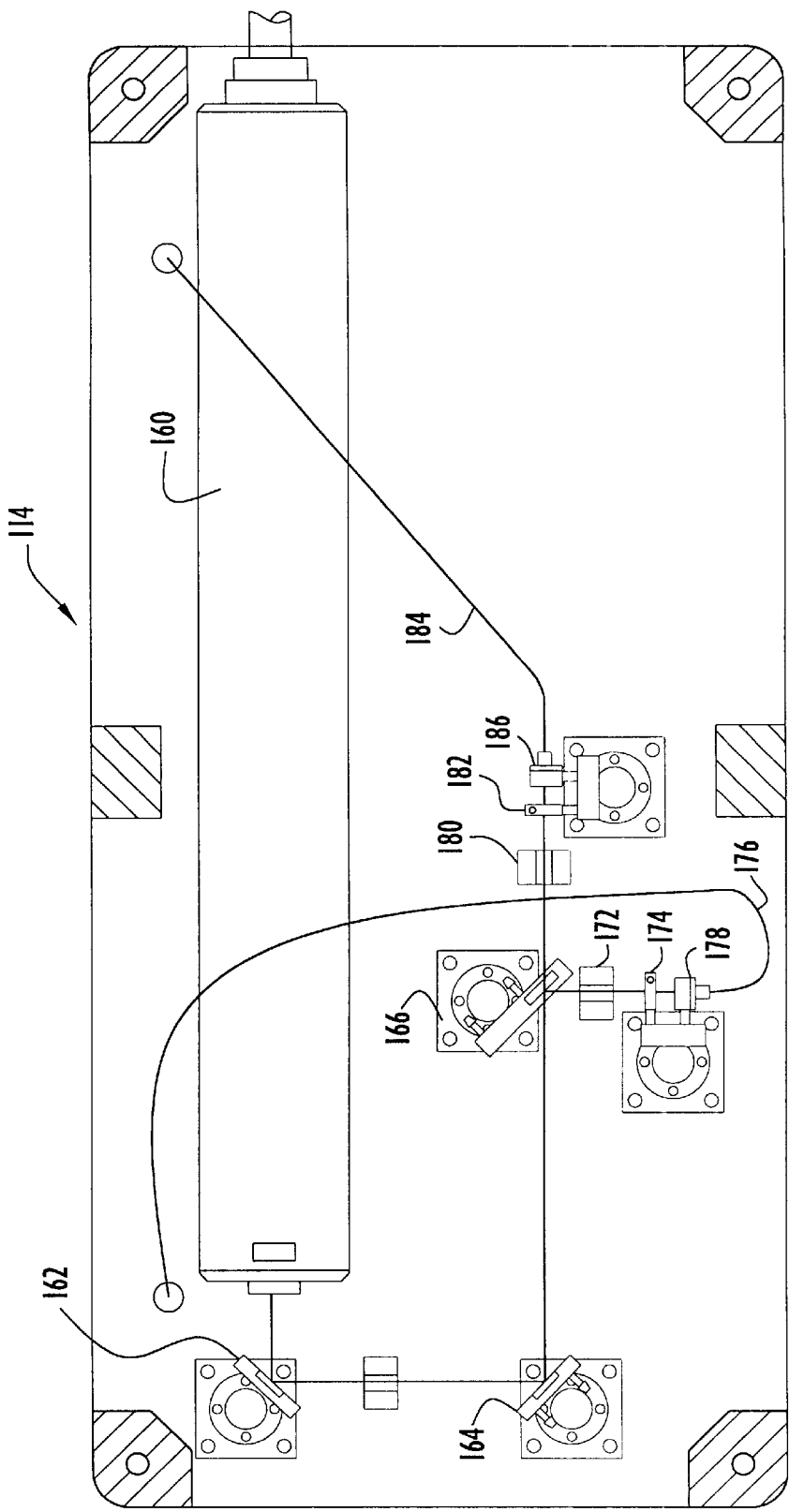
FIG. 11 is a plan view of the laser source platform depicting the laser beam source and dividing circuit of the patterning tool shown in FIG. 10.

FIG. 11 is an overhead plan view of the platform 115 containing an embodiment of laser source 114, and represents an optical diagram showing the free-space laser beam path, conventional beam splitting and directing optics, fiber-optic coupling connectors, cables and the opto-mechanical hardware for mounting and aligning the optics and fiber-optic cables. The laser depicted can be, for example, an argon-ion gas laser 160 generating a polarized, single-frequency (or optionally a single-line) beam with a wavelength of 457.9 nanometers, in the blue range of the visible spectrum. Alternatively, the laser can be a helium-cadmium laser producing blue light at a wavelength of 442 nm. As noted above, the choice of a blue wavelength contributes to the large field-size, flexible beam delivery, and enhanced illumination uniformity advantages of the tool system of the present invention. Laser source 160 generates a coherent light source beam directed through a sequence of first and second turning mirrors 162 and 164, and then to a beam splitter 166 which divides the single beam into two equal portions. The beam splitter 166 reflects a portion of an incident laser beam and allows the remainder to pass through, such that a portion of the coherent light source beam incident upon beam splitter 166 is reflected at an angle toward a first electronic shutter 172 (which is in an open, light transmissive state) and on through first waveplate 174 and is launched into the first flexible fiber optic patch cord 176 via a connectorized mounted fiber positioning stage 178. The light passed through beam splitter 166 is transmitted through a second electronic shutter 180 (when in the open, light transmissive state), through a second waveplate 182 and is launched into a second flexible fiber optic patchcord 184 via a second connectorized mounted fiber positioning stage 186. A conventional mechanism can be used to maintain phase coherence between the beams.

Once launched into and contained by the flexible fiber-optic patch cords 176 and 184, the two beams are easily manipulated simply by moving the fiber optic patch cords. The fiber optic cables 176 and 184 are directed through an access hole in the translation stage table and then up along the gantry support posts to the beam delivery breadboard level.

Figure 12:
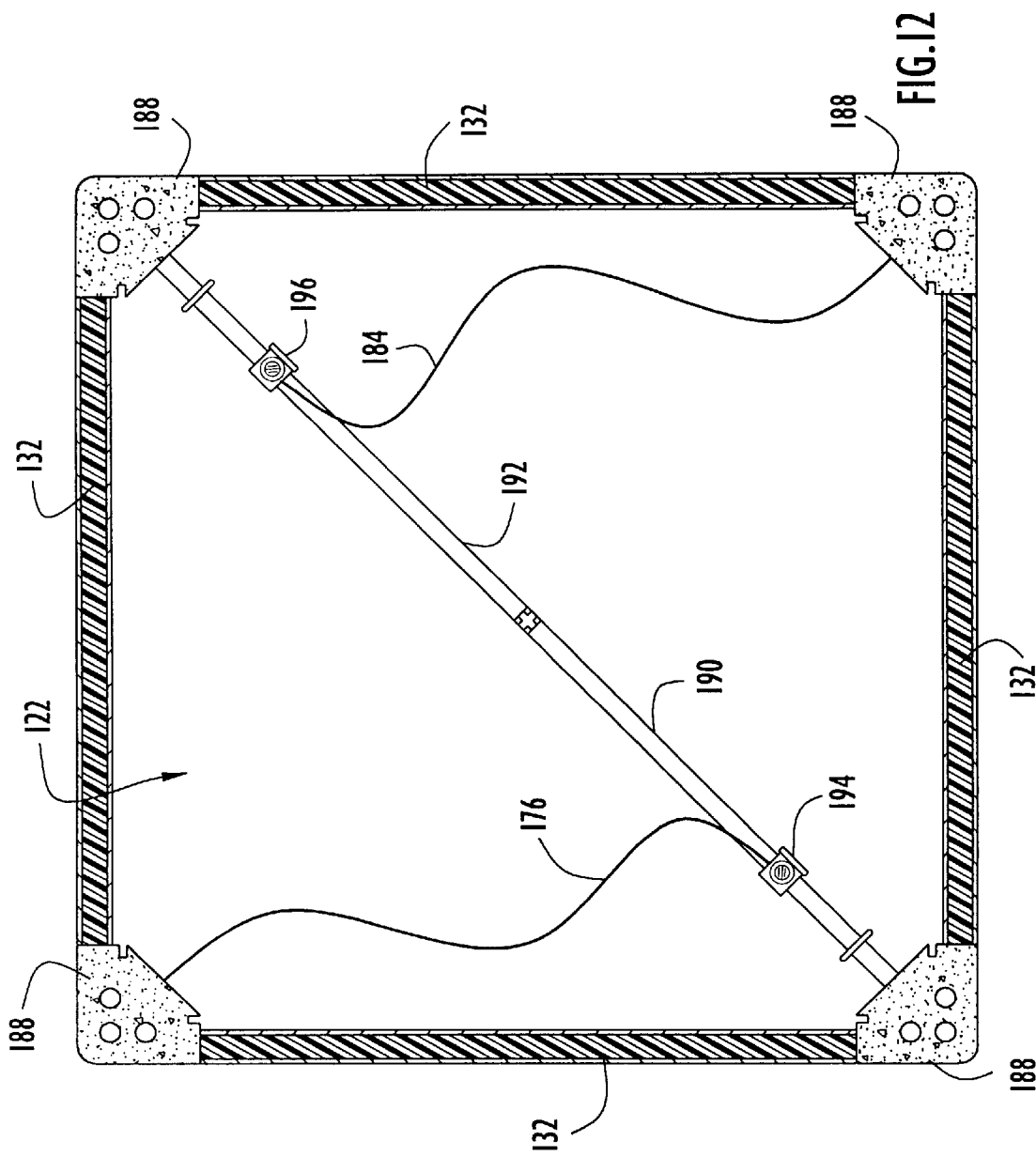
FIG. 12 is a plan view of the laser beam gantry support system of the patterning tool shown in FIG. 10

FIG. 12 is an overhead view of an embodiment of the laser beam gantry support system. The support system includes planar support beam delivery breadboard 122 (FIG. 1) affixed to four precision machined vertical granite columns or stanchions 188. First and second rails 190 and 192 are bolted to breadboard 122 and lie end-to-end along a diagonal line extending between opposite corners of breadboard 122. The output ends of fiber optic cables 176 and 184 are respectively mounted on carriage-mounted rotatable fiber positioning stages 194 and 196 (e.g., having a two-axis rotatable gimbal). The fiber positioning stages 190 and 192 are in turn positioned on rails 190 and 192. Positioning stages 194 and 196 can be positioned along the length of rails 194 and 196. A manual procedure can be used to reposition stages 194 and 96. Graduated stops along the rails can be located at commonly selected positions. Preferably, the positioning of the stages in automated (i.e., the stages are moved via computer control as a function of the desired interference pattern). As explained above, the carriage position defines the range of pattern feature size and pattern feature spacing. Laser beams emanating from the fiber-optic cable output ends are directed downwardly towards the middle (workpiece mount) level 116.

Figure 13:
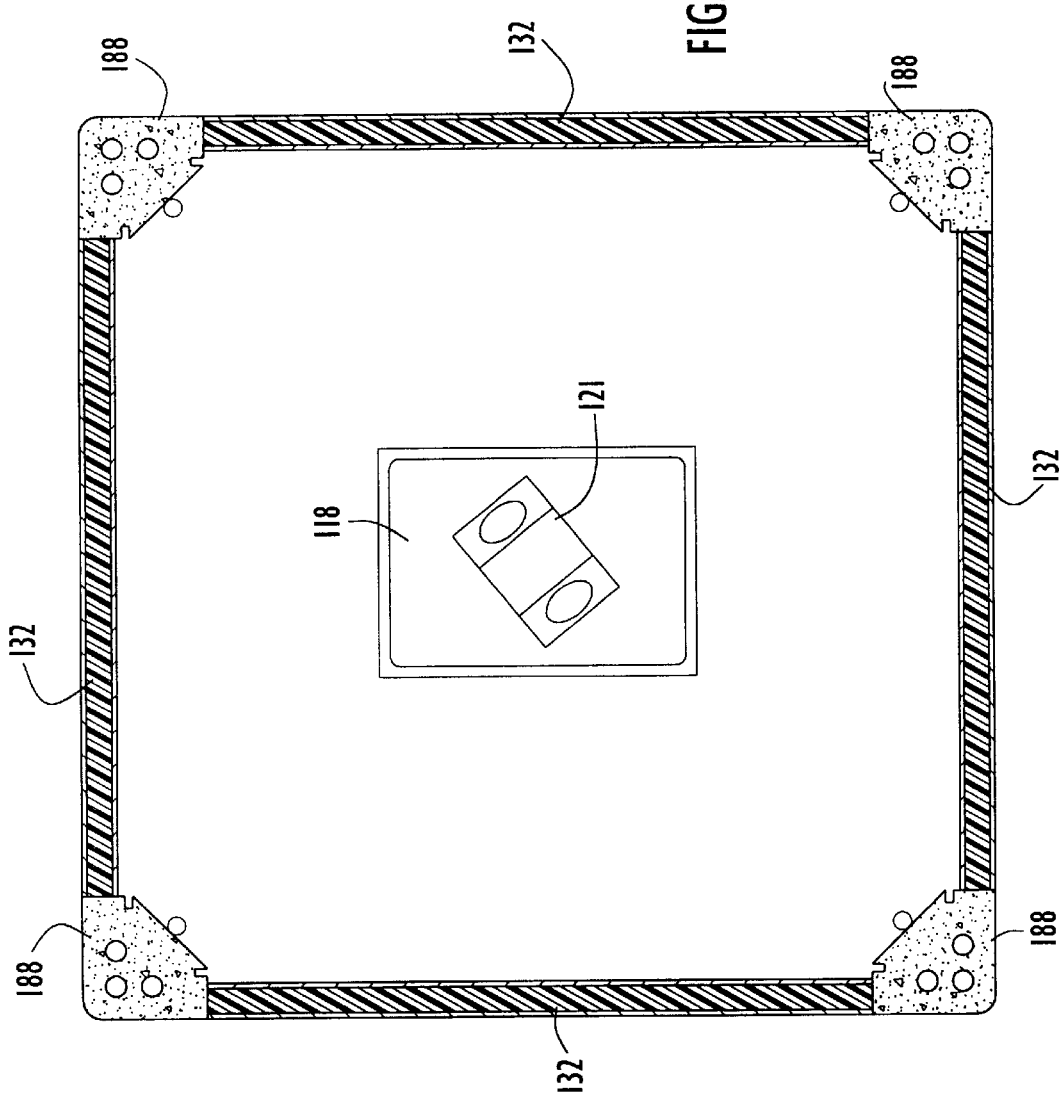
FIG. 13 is a plan view of the prism and workpiece platform of the patterning tool shown in FIG. 10.

FIG. 13 is an overhead view of the middle level 116 depicting the prism 121 and platform 118 on which the workpiece 119 is mounted. Pneumatic, electrical and fluid lines are routed through platform 118 to the lower level 112. Platform 118 can be, for example, a wafer chuck with a vacuum module, a fluid seal, and fluid dispensing and drain ports. X-Y translation stage 120 (not shown in FIG. 13) can move platform 118 from a wafer loading position to an exposure position (the position shown in FIG. 13).

While the foregoing embodiments depict a two-beam system for generating linear grating interference patterns, it will be understood that the present invention is not limited to two-beam systems. In general, the prism coupling technique of the present invention can be used in a holographic lithography system having any number of illuminating beams. For example, the three and four beam patterning tools described in U.S. patent application Ser. No. 09/202, 367 now U.S. Pat. No. 6,088,505 can be modified to include a prism optically coupled to the workpiece. For a three beam system, the prism includes three inclined faces that correspond to and respectively receive the three illuminating beams. Similarly, for a four beam system, the prism includes four inclined faces that correspond to and respectively receive the four illuminating beams. Further, the present invention has application in a system in which a beam is incident on the apex of a multi-faceted prism to generate multiple interfering beams As described in the aforementioned U.S. patent application Ser. No. 09/202,367, there are a number of alternatives for dividing the source beam into two or more illuminating beams. For example, in addition to the aforementioned beam-splitter technique, the source beam can be divided into two or more coherent beams upon being directed through a diffractive fanout, through serially arrayed fanouts, through a grating coupled frustrated total internal reflection device (FTIR) (comprised of a slab waveguide with spaced diffractive elements), or a mode cross-coupling integrated optic waveguide divider (including a slab waveguide with branching trees and optional electro-optic phase modulators), to generate the number of beams desired. As described above, the beam from laser source 160 is divided, in one of the aforementioned manners and launched into fiber-optic cables at the cable proximal ends. Coupling of laser light into single-mode, polarization maintaining fiber (optical waveguide) has traditionally been a difficult task due to the small fiber core diameters—typically in the two to four micron range. Recently, however, fiber-optic cable manufacturers have been "connectorizing" cable products with mechanical mounting hardware and optics, usually for collimating the light emanating from the fiber ends. However, in the present invention, a typical fiber collimator is operated in a reverse sense, whereby nearly collimated laser light is coupled into the fibers at the fiber proximal ends (e.g., at the mounted fiber positioning stages 178 and 186), whereupon the alignment tolerances for launching light into the fiber are greatly increased and coupling stability is vastly improved. These advantages, together with the flexible nature of the fiber cables, make fiber cables well suited for use in the manufacturing tool of the present invention.

Another surprising advantage obtained by employing fiber-optic cables is the ability of fiber optic cables to replace the function of conventional spatial filters used in laboratory setups. The act of coupling the laser light into the fiber cable eliminates amplitude noise in the beams and produces highly divergent beams as a result of the confinement of the light within the small diameter fiber core. The highly divergent beams emanating from the ends of fiber cables (FIG. 10) have a high numerical aperture. The fibers are cut to lengths which allow the optical path lengths to be set equal, thereby allowing the laser to operate at an increased power level afforded by the presence of multiple longitudinal modes, or, using industry terminology, single-line operation. Optionally, an optical element, such as a conventional diffusing element (not shown), can be connected to the output end of each fiber to impart both phase and amplitude noise or aberration which, in conjunction with the highly divergent beam emanating from the fiber output end, tailors the phase noise. This combination yields precise control over the illuminating beam divergence without the unacceptable spatial noise as is typically found when using diffusers. The advantageous combination of a fiber optic waveguide and a phase aberrating diffuser modifies the resulting illumination beam, thus averaging out the spatial noise and reducing errors in the resulting holographic pattern. Optical element can be, for example, a diffuser having a diffusing angle in the range of 5°–40° (uniform or gaussian) and is preferably selected to optimize microscopic feature uniformity. Alternatively, the optical element can be a mirror including diffusing and enlarging surfaces, employed in a reflective-mode operation. Further, refractive lenses or other optics can be placed at the output end of the optical fibers to optimize the divergence angle of the beams.

The prism elements described in the exemplary embodiments are symmetric with respect to the illuminating beams. However, the present invention is not limited to such symmetric prisms. For example, the prism can have a 60° angle on one side and a 70° angle on the other side. Such a prism would produce a grating having a pitch that varies across the wafer. Further, the faces of the prism need not be flat, as shown in the exemplary embodiments. A prism with curves faces can be used, for example, to modify the divergence of the beams.

While in the above described embodiments, the centroids of the illuminating beams overlap substantially in the recording plane (i.e., the plane in which the photosensitive layer lies), according to the present invention, the recording plane can be offset from the plane in which the illuminating beam centroids overlap. (The plane containing the intersecting beam centroids is the plane defined by the point of intersection of the centers of the illuminating beams.) As described in detail in U.S. patent application Ser. No. 09/202,367, by shifting the recording plane in the "z-direction" relative to the point source plane (i.e., vertically toward or away from the beam delivery system in FIG. 10), a "shifted illumination" results. In the shifted recording plane, the centroids are somewhat offset from each other, causing an averaging out (reduction in variation) of the beam intensity over a limited area. This shifted illumination technique increases the usable field size of the system (which is limited by the tolerable intensity variation in the sum of the exposing beams), since for a given area in the center of the recording plane, the intensity variation is reduced. For example, an offset in the range of approximately 5 cm to 10 cm between the recording plane and the plane in which the centroids overlap yields an improved field size.

In the beam delivery system shown in exemplary embodiments, the illuminating beams emanate from a common plane that is parallel to the recording plane. More generally, according to the present invention, the beams need not be located in a common plane parallel to the recording plane.

The prism coupling technique of the present invention has been described in the context of a patterning tool employing a fiber optic beam delivery system operating the blue wavelength region of the spectrum. While the prism coupling technique is particularly useful in this context, it will be understood that the prism coupling technique of the present invention can be used with any type of beam delivery system at any useful wavelength. Thus, for example, the present invention can used at UV or near-UV wavelengths. If permitted by advances in fiber optic technology, such wavelengths may become compatible with fiber optic delivery systems.

The two-beam interference pattern produce by the system of the exemplary embodiment described herein is useful for producing distributed feedback grating for telecommunications applications. More generally, the technique of the present invention relates to any plural beam holographic lithography system that generates interferometic patterns suitable for exposing photosensitive materials used in a wide variety of other applications, including but not limited to: FED technology, formation of motheye surfaces, the manufacture of LCDs, surface texturing, and fabrication of semiconductor circuitry.

Having described preferred embodiments of new and improved holographic patterning method and tool employing prism coupling, it is believed that other modifications, variations and changes will be suggested to those skilled in the art in view of the teachings set forth herein. It is therefore to be understood that all such variations, modifications and changes are believed to fall within the scope of the present invention as defined by the appended claims.

What is claimed is:

1. A holographic lithography system for generating an interference pattern suitable for selectively exposing a photosensitive material, comprising:

a platform for mounting a workpiece having a photosensitive surface;

a beam delivery system configured to direct a plurality of illuminating beams toward said platform in an overlapping manner to form an optical interference pattern in the vicinity of the workpiece, said beam delivery system including: a plurality of optical fibers having transmissive ends from which the illuminating beams respectively emanate divergently; and a support structure on which the transmissive ends of the optical fibers are adjustable mounted, such that positions and angles of the illuminating beams relative to said platform can be adjusted by moving the transmissive ends of the optical fibers to different points on the support structure; and a prism in optical contact with the photosensitive surface, said prism refracting the illuminating beams incident on said prism and transmitting the refracted illuminating beams toward the workpiece, such that the photosensitive surface of the workpiece is selectively exposed by the illuminating beams refracted by said prism.

2. The system of claim 1, wherein said prism is in optical contact with the photosensitive surface via an intervening index matching fluid having an index of refraction substantially matching the index of refraction of said prism.

3. The system of claim 2, wherein said index matching fluid is water.

4. The system of claim 3, wherein the water is distilled water.

5. The system of claim 2, wherein said index matching fluid is disposed in a gap between said prism and the photosensitive surface, the gap being in the range between approximately 1 mm and 5 mm.

6. The system of claim 5, wherein the gap is in the range between approximately 1 mm and 2 mm.

7. The system of claim 1, wherein said prism has a base facing said platform and inclined faces corresponding to the illuminating beams.

8. The system of claim 7, wherein faces of the prism are substantially flat.

9. The system of claim 7, wherein the faces of the prism are curved.

10. The system of claim 1, wherein said prism is a substantially equilateral prism.

11. The system of claim 1, wherein said prism is asymmetrical.

12. The system of claim 1, wherein the beam delivery system delivers illuminating beams having a wavelength in the blue range of the visible spectrum.

13. The system of claim 1, wherein said beam delivery system further includes:
a coherent light source generating a coherent light source beam;
a beam splitter circuit adapted to divide the coherent light source beam into a plurality of coherent beams and launch the coherent beams into input ends of the optical fibers, the coherent beams emanating from the transmissive ends of the optical fibers as the illuminating beams.

14. The system of claim 13, wherein said coherent light source is an argon-ion gas laser and the coherent light source beam is a laser beam having a wavelength in the blue range of the visible spectrum.

15. The system of claim 1, wherein said beam delivery system generates two illuminating beams that overlap, such that the optical interference pattern includes substantially parallel grating lines suitable for exposing the photosensitive surface to form a latent image corresponding to a distributed feedback grating.

16. The system of claim 15, where said prism has two faces corresponding to the two illuminating beams.

17. The system of claim 1, wherein said beam delivery system generates three illuminating beams that overlap to form the optical interference pattern, and said prism has three faces corresponding to the three illuminating beams.

18. The system of claim 1, wherein said beam delivery system generates four illuminating beams that overlap to form the optical interference pattern, and said prism has four faces corresponding to the four illuminating beams.

19. The system of claim 1, wherein a point of intersection of centers of the illuminating beams is in a reference plane lying substantially along the photosensitive surface of the workpiece.

20. The system of claim 1, wherein a point of intersection of centers of the illuminating beams is in a reference plane that is offset from the photosensitive surface of the workpiece by an offset distance.

21. The system of claim 20, wherein the offset distance is in the range between approximately five to ten centimeters.

22. The system of claim 1, wherein said platform is configured to receive a workpiece comprising a wafer having at least a substrate and a photoresist coating.

23. A method of performing holographic lithography for generating an interference pattern suitable for selectively exposing a photosensitive material, the method comprising the steps of:
(a) generating a plurality of divergent illuminating beams that are directed through an ambient environment having a known index of refraction by transmitting the illuminating beams from transmissive ends of a plurality of optical fibers and adjustably mounting the transmissive ends of the optical fibers on a support structure such that positions and angles of the illuminating beams relative to the photosensitive material can be adjusted by moving the transmissive ends of the optical fibers to different points on the support structure;

(b) passing the illuminating beams through a medium having a higher index of refraction than the known index of refraction, the illuminating beams refracted by the medium overlapping to form an optical interference pattern; and (c) exposing the photosensitive material with the light interference pattern formed by the refracted illuminating beams.

24. The method of claim 23, wherein step (b) includes placing the medium in optical contact with the photosensitive material via an intervening index matching fluid having an index of refraction substantially matching the index of refraction of the medium.

25. The method of claim 24, wherein step (b) includes using water as the index matching fluid.

26. The method of claim 25, wherein step (b) includes using distilled water as the index matching fluid.

27. The method of claim 24, wherein step (b) includes disposing the index matching fluid in a gap between the medium and the photosensitive material.

28. The method of claim 27, wherein step (b) includes forming the gap to be in the range between approximately 1 mm and 5 mm.

29. The method of claim 28, wherein step (b) includes forming the gap to be in the range between approximately 1 mm and 2 mm.

30. The method of claim 24, wherein step (a) includes automatically positioning the illuminating beams via computer control as a function of a desired interference pattern.

31. The method of claim 23, wherein step (a) includes generating illuminating beams having a wavelength in the blue range of the visible spectrum.

32. The method of claim 23, wherein step (a) includes generating two illuminating beams that overlap, such that the optical interference pattern includes substantially parallel grating lines suitable for exposing the photosensitive material to form a latent image corresponding to a distributed feedback grating.

33. The method of claim 23, wherein step (a) includes generating three illuminating beams that overlap to form the optical interference pattern.

34. The method of claim 23, wherein step (a) includes generating four illuminating beams that overlap to form the optical interference pattern.

35. The method of claim 23, wherein a point of intersection of centers of the illuminating beams is in a reference plane lying substantially along a surface of the photosensitive material.

36. The method of claim 23, wherein a point of intersection of centers of the illuminating beams is in a reference plane that is offset from a surface of the photosensitive material by an offset distance.

37. The method of claim 36, wherein the offset distance is in the range between approximately five to ten centimeters.

38. The method of claim 23, wherein step (a) further includes:
(a3) generating a coherent light source beam;
(a4) dividing the coherent light source beam into a plurality of coherent beams; and
(a5) launching the coherent beams into input ends of the optical fibers.

39. A holographic lithography system for generating an interference pattern suitable for selectively exposing a photosensitive material, comprising:
a platform for mounting a workpiece having a photosensitive surface;
a beam delivery system configured to direct three illuminating beams toward said platform in an overlapping manner to form an optical interference pattern in the vicinity of the workpiece; and a prism in optical contact with the photosensitive surface and having three faces corresponding to the three illuminating beams, said prism refracting the illuminating beams incident on said prism and transmitting the refracted illuminating beams toward the workpiece, such that the photosensitive surface of the workpiece is selectively exposed by the illuminating beams refracted by said prism.

40. The system of claim 39, wherein said beam delivery system generates four illuminating beams that overlap to form the optical interference pattern, and said prism has four faces corresponding to the four illuminating beams.

41. The system of claim 39, wherein said beam delivery system includes:

a plurality of optical fibers having transmissive ends from which the illuminating beams respectively emanate divergently; and a support structure on which the transmissive ends of the optical fibers are adjustably mounted, such that positions and angles of the illuminating beams relative to said platform can be adjusted by moving the transmissive ends of the optical fibers to different points on the support structure.

42. A holographic lithography system for generating an interference pattern suitable for selectively exposing a photosensitive material, comprising:

a platform for mounting a workpiece having a photosensitive surface;

a beam delivery system configured to direct a plurality of illuminating beams toward said platform in an overlapping manner to form an optical interference pattern in the vicinity of the workpiece; and a prism in optical contact with the photosensitive surface and having a base facing said platform and inclined curved faces corresponding to the illuminating beams, said prism refracting the illuminating beams incident on said prism and transmitting the refracted illuminating beams toward the workpiece, such that the photosensitive surface of the workpiece is selectively exposed by the illuminating beams refracted by said prism.

43. The system of claim 42, wherein said beam delivery system includes:

a plurality of optical fibers having transmissive ends from which the illuminating beams respectively emanate divergently; and a support structure on which the transmissive ends of the optical fibers are adjustably mounted, such that positions and angles of the illuminating beams relative to said platform can be adjusted by moving the transmissive ends of the optical fibers to different points on the support structure.

44. The system of claim 42, wherein said beam delivery system generates two illuminating beams that overlap, such that the optical interference pattern includes substantially parallel grating lines suitable for exposing the photosensitive surface to form a latent image corresponding to a distributed feedback grating.

45. The system of claim 42, wherein said beam delivery system generates three illuminating beams that overlap to form the optical interference pattern, and said prism has three faces corresponding to the three illuminating beams.

46. The system of claim 42, wherein said beam delivery system generates four illuminating beams that overlap to form the optical interference pattern, and said prism has four faces corresponding to the four illuminating beams.

47. A method of performing holographic lithography for generating an interference pattern suitable for selectively exposing a photosensitive material, the method comprising the steps of:

(a) generating three divergent illuminating beams that are directed through an ambient environment having a known index of refraction;

(b) passing the illuminating beams through a medium having a higher index of refraction than the known index of refraction, the illuminating beams refracted by the medium overlapping to form an optical interference pattern; and (c) exposing the photosensitive material with the light interference pattern formed by the refracted illuminating beams.

48. The method of claim 47, wherein step (a) includes generating four illuminating beams that overlap to form the optical interference pattern.

49. The method of claim 47, wherein step (a) includes:

(a1) transmitting the illuminating beams from transmissive ends of a plurality of optical fibers; and (a2) adjustably mounting the transmissive ends of the optical fibers on a support structure, such that positions and angles of the illuminating beams relative to the photosensitive material can be adjusted by moving the transmissive ends of the optical fibers to different points on the support structure.

50. A method of performing holographic lithography for generating an interference pattern suitable for selectively exposing a photosensitive material, the method comprising the steps of:

(a) generating a plurality of divergent illuminating beams that are directed through an ambient environment having a known index of refraction;

(b) passing the illuminating beams through a medium having curved faces and a higher index of refraction than the known index of refraction, the illuminating beams refracted by the medium overlapping to form an optical interference pattern; and (c) exposing the photosensitive material with the light interference pattern formed by the refracted illuminating beams.

51. The method of claim 50, wherein step (a) includes:

(a1) transmitting the illuminating beams from transmissive ends of a plurality of optical fibers; and (a2) adjustably mounting the transmissive ends of the optical fibers on a support structure, such that positions and angles of the illuminating beams relative to the photosensitive material can be adjusted by moving the transmissive ends of the optical fibers to different points on the support structure.

52. The method of claim 50, wherein step (a) includes generating two illuminating beams that overlap, such that the optical interference pattern includes substantially parallel grating lines suitable for exposing the photosensitive material to form a latent image corresponding to a distributed feedback grating.

53. The method of claim 50, wherein step (a) includes generating three illuminating beams that overlap to form the optical interference pattern.

54. The method of claim 50, wherein step (a) includes generating four illuminating beams that overlap to form the optical interference pattern.

* * * * *